United States Patent

Takizawa et al.

[11] Patent Number: 5,620,924
[45] Date of Patent: Apr. 15, 1997

[54] METHOD OF PREVENTING DETERIORATION OF FILM QUALITY OF TRANSPARENT CONDUCTIVE FILM

[75] Inventors: Yutaka Takizawa; Ken-ichi Yanai, both of Kawasaki, Japan

[73] Assignee: Fujitsu Limited, Kawasaki, Japan

[21] Appl. No.: 407,957

[22] Filed: Mar. 22, 1995

Related U.S. Application Data

[62] Division of Ser. No. 297,155, Aug. 29, 1994, Pat. No. 5,429,983.

[30] Foreign Application Priority Data

Dec. 27, 1993 [JP] Japan ............................ 5-330661
Mar. 18, 1994 [JP] Japan ............................ 6-049528

[51] Int. Cl.$^6$ .................. G02F 1/13; H01L 21/205
[52] U.S. Cl. .............. 427/108; 427/126.3; 427/109; 438/609
[58] Field of Search .............. 437/181, 2, 228 SD; 427/75, 126.3, 108, 109, 419.3, 444

[56] References Cited

U.S. PATENT DOCUMENTS

| | | |
|---|---|---|
| 4,554,557 | 11/1985 | Kimoto et al. . |
| 4,876,218 | 10/1989 | Pessa et al. ............... 437/132 |
| 5,010,033 | 4/1991 | Tokunaga et al. . |
| 5,134,091 | 7/1992 | Chikyou et al. .......... 437/111 |
| 5,141,893 | 8/1992 | Ito et al. ................. 437/111 |
| 5,229,332 | 7/1993 | Cho ......................... 117/105 |
| 5,242,530 | 9/1993 | Batey et al. . |
| 5,242,580 | 9/1993 | Batey et al. ............. 437/89 |

FOREIGN PATENT DOCUMENTS

| | | |
|---|---|---|
| 57-193025 | 11/1982 | Japan . |
| 61-174196 | 8/1986 | Japan . |
| 62-96667 | 5/1987 | Japan . |
| 58-120595 | 7/1993 | Japan . |

OTHER PUBLICATIONS

G.N. Parsons, Applied Physics Letters 59, IBM Research Division, New York, Aug. 16, 1991, pp. 2546–2548.
Chourasa et al. in "nature, vol. 249, May 1974, pp. 28–29, in Ultra thin conducting films of gold on platinum nucleating layers".

*Primary Examiner*—George Fourson
*Assistant Examiner*—Scott Kirkpatrick
*Attorney, Agent, or Firm*—Armstrong, Westerman, Hattori, McLeland & Naughton

[57] ABSTRACT

A method of manufacturing a semiconductor device according to the present invention comprises the steps of forming a conductive film on an insulating film, forming growth nucleuses containing any of elements in group IIIb, group IVb, group Vb and group VIIb that does not constitute the conductive film and the insulating film on the surface of the conductive film, and growing a semiconductor selectively on growth nucleuses.

11 Claims, 19 Drawing Sheets

FIG.8

<Specimen A>

<Specimen B>

<Specimen C>

<Present Invention>

METHOD OF PREVENTING DETERIORATION OF FILM QUALITY OF TRANSPARENT CONDUCTIVE FILM

This is a division, of application Ser. No. 08/297,155 filed Aug. 29, 1994 now U.S. Pat. No. 5,429,983.

BACKGROUND OF THE INVENTION

1. Field of the Invention

The present invention relates to a method of preventing the deterioration of the film quality of a transparent conductive film, to a semiconductor device and to a method of manufacturing a semiconductor device.

2. Description of the Related Art

A portable information processor is indispensable for performing electronic data processing (EDP) on an individual level, and a liquid crystal display unit is used as a man-machine interface required for utilizing EDP. It is desired that the image display unit produce a display of high density and good color capable of performing advanced information processing, image processing or the like, at a low cost.

An active matrix type liquid crystal display unit is constructed of switching elements are connected to a plurality of display units called picture elements, making a high grade display possible. A semiconductor element, such as a diode or a transistor, is used as the switching element.

The properties of the switching elements should be excellent because they are the primary factors for determining the number of gradation and the display capacity of the liquid crystal display unit. Further, since these switching elements are manufactured through a complicated process accompanied by fine processing. Simplifying the process for making switching elements, simplifies the process for making the entire liquid crystal display unit.

As a means for simplifying the manufacturing process for the switching element, it has been considered to form a new pattern on the pattern already formed on a substrate by self alignment. A technique exists for growing a thin film selectively on a conductive pattern as a process for forming a self aligned pattern.

Since it is possible, by selective growth, to form a layer selectively only on a thin film applied with patterning on a substrate, photolithography process becomes unnecessary. Further, since it is possible to grow still another thin film continuously without breaking vacuum after the selective forming process, contamination on interlayer interfaces is small, and the switching element properties are improved.

In the many selective growth techniques that have been developed, a chemical vapor deposition (CVD) method is utilized to achieve selective growth by the difference in chemical property of layer surfaces.

The CVD method is used frequently as a growth method for a semiconductor or a metal, but the growth rate is not fully controlled by the conditions that reflect the chemical disposition of the layer surface, selective deposition of a film does not always occur. However, it has become possible to obtain selective growth by reducing the deposition rate by diluting the growth gas with another gas, or by having the chemical disposition of the layer surface reflected by bringing etching and deposition close to an equilibrium state.

As a technique for the selective growth of silicon, there is, for example, the epitaxial lateral overgrowth (ELO) method disclosed in Japanese Patent Provisional Publication No. SH058-120595. That technique is a method of expanding the margin of a selective growth of silicon by repeating deposition and etching of layers alternately for a substrate having a region where silicon is grown and a region where silicon is difficult to be grown.

It has been disclosed in U.S. Pat. No. 5,242,530 that this technique is also applicable to a plasma CVD method widely used in the manufacture of a solar cell and an active matrix type liquid crystal display unit.

These techniques involve repeating etching and deposition alternately by utilizing a slight difference in the silicon growth rate produced by a difference between materials forming the layers. However, since the chemical state of the surface of a layer depends on the material constituting the layer, growth has to be performed very slowly in order to achieve selective silicon growth between materials having similar chemical dispositions.

When the rate of film formation is increased in order to shorten process time, growth becomes non-selective. Thus, there is the problem that the film forming process has to be performed for a long period of time by slowing down the rate of film formation in order to achieve selective growth.

It is necessary to increase the amount of time for etching in the overall time for processing to remove the silicon film deposited on unused parts in order to make selective growth uniform in an active matrix having a large area. As a result, the period of time for film deposition is reduced, the overall time for the selective growth process gets longer, and productivity declines.

Further, it depends on the material constituting the surface of the layer where the film is grown whether silicon is grown or not, the state of the layer surface is also changed by contamination and by natural oxidation. Thus, when the technique of selective growth is examined practically from the viewpoint of a manufacturing process, it has more or less lacked practicability.

For example, ITO is an electrically degenerated semiconductor and functions as an electrode, but resembles in a chemical disposition silicon oxide which is the oxide, such as quartz and glass, constituting the substrate. Since ITO is an oxide, there is little difference in the process when silicon is grown on ITO and on the substrate. Further, the reducing gas used when silicon is grown selectively on the surface of the transparent conductive film deteriorates the surface of the transparent conductive film.

Accordingly, it is difficult to perform selective growth on either one of two films having similar chemical dispositions. Practically, according to the examination of the present inventor, it has been found that the reproducibility of selective growth is poor, non-selective deposition of silicon films occurs frequently and the silicon film is deposited on the quartz substrate only.

SUMMARY OF THE INVENTION

It is an object of the present invention to provide a method of preventing the deterioration of the surface of a transparent conductive film, and also to provide a method of manufacturing a semiconductor device capable of selectively growing a semiconductor easily on the transparent conductive film.

According to the present invention, growth nuclei containing any element of group IIIb, group IVb, group Va and group VIIb that does not form a conductive film are formed on a surface of a conductive film that becomes a substrate for selective growth. Insulating layers are formed, and a semiconductor is selectively grown on the conductive film. The semiconductor layer is readily grown selectively by varying chemical disposition of the surface of the conductive film and the insulating layer therearound.

Further, according to the present invention, a layer containing an element of growth Va is formed by having at least the element of group Va contained in the surface of a transparent conductive film composed of an oxide.

When the transparent conductive film containing oxygen is placed in an reducing atmosphere, reduction of the transparent conductive film is controlled by the layer containing the element of group Va, deterioration of the film quality of the transparent conductive film is prevented, and it becomes more difficult to lower the conductivity and transparency of the film.

This layer containing an element of group Va is formed in a self aligned manner by replacement of oxygen with the element of group VA on the surface of the transparent conductive film by placing the transparent conductive film in an active atmosphere containing the element of group Va. Consequently, it is not necessary to utilize a special processing or patterning technique. For example, the layer containing an element of group Va is formed by a simple process prior to growing a semiconductor selectively on the transparent conductive film.

When the layer containing an element of group Va is formed in an active atmosphere at a temperature of 200° C. or higher, an elimination reaction of oxygen from the transparent conductive film containing oxygen occurs to a great extend, and the layer containing the element of group Va becomes more difficult to form on the film. Therefore, it is required to set the temperature to 200° C. or below. In particular, room temperature is desirable in order to make the vapor pressure of the element of group Va lower.

DESCRIPTION OF THE PREFERRED EMBODIMENTS (The First Embodiment)

FIGS. 1A to 1D are sectional views showing a process of selective growth in an embodiment of the present invention.

Figure 1A:
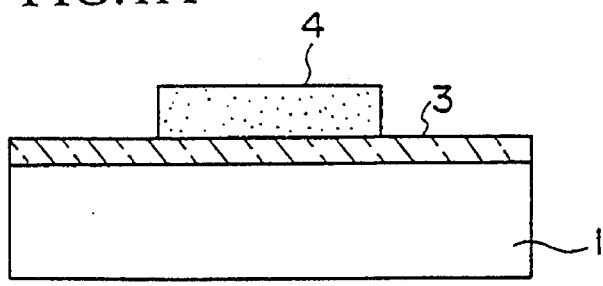
FIGS. 1A to FIG. 1E are sectional views showing a selective growth method according to a first embodiment of the present invention.

First, as shown in FIG. 1A, a transparent conductive film 3 composed of a metallic oxide, for example, on indium oxide film added with tin (ITO: Indium Tin Oxide, is formed by DC sputtering on a transparent insulating substrate 1 composed of glass, quartz or the like. Then, photoresist 4 is applied, is exposed and developed to form a pattern on the metallic oxide.

Figure 1B:
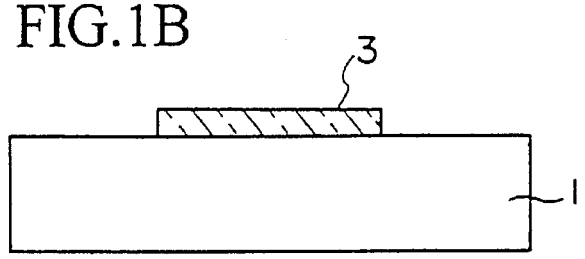

Next, as shown in FIG. 1B, the transparent conductive film 3 with the photoresist 4 as a mask is patterned by photolithography. After patterning is completed, the photoresist is removed.

Thereafter, the insulating substrate 1 is placed in an active atmosphere containing an element an group IIIb, group Ivb or group Va of the periodic table, and the element is stuck to and introduced into the surface of the transparent conductive film 3. An atmosphere containing $NH_3$ or $PH_3$, formed into plasma, is available for example as the active atmosphere.

Figure 1C:
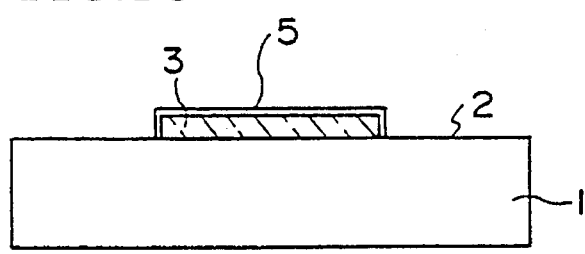
Figure 1E:
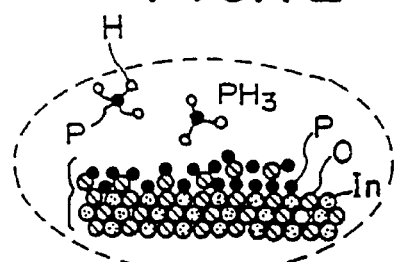
Figure 1D:
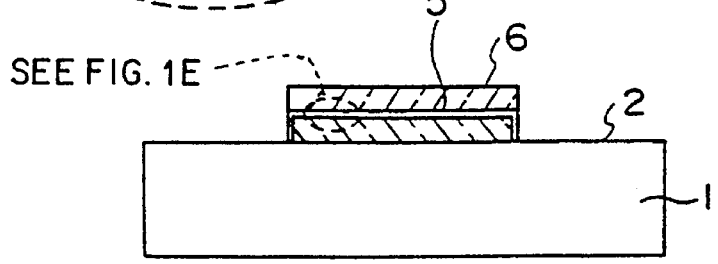

Growth nuclei (growth seeds) 5 composed of a metallic oxide containing an element in group IIIb, group Ivb or group Va is formed on the surface of the conductive oxide as shown in FIG. 1C. The growth nuclei may form a thin layer. Since the layer of growth nuclei is formed in a self aligned manner only on the surface of the transparent conductive film 3, it is not necessary to utilize a special working or patterning technique.

Thereafter, as shown in FIG. ID, an amorphous semiconductor film 6 is grown selectively on the transparent conductive film 3 covered with the layer of growth nuclei 5 using a CVD method.

Now, a silicon film has been grown selectively only on an ITO film under the following conditions by using the ITO film as the transparent conductive film 3 and a quartz substrate as the insulating substrate 1.

First, the insulating substrate 1 having a conductive oxide layer 3 thereon is placed in a chamber (not illustrated) or in a parallel-plate electrode type plasma CVD apparatus. Then, while maintaining the inside of the chamber at 1.0 Torr, phosphine ($PH_3$) gas (concentration: 0.5 at. %) diluted with hydrogen is introduced into the chamber, and a radio frequency (RF) power source of 13.56 Mhz and 300 W is connected between electrodes surrounding the insulating substrate 1 while maintaining the substrate temperature at 200° C. or below, preferably at room temperature. By placing the insulating substrate 1 in the phosphine plasma atmosphere for 20 minutes under these conditions, as the surface transparent conductive oxide film 3 is reformed to contain phosphorus (P) and the growth nucleus layer 5 is formed on the surface of the transparent conductive film 3.

Figure 2:
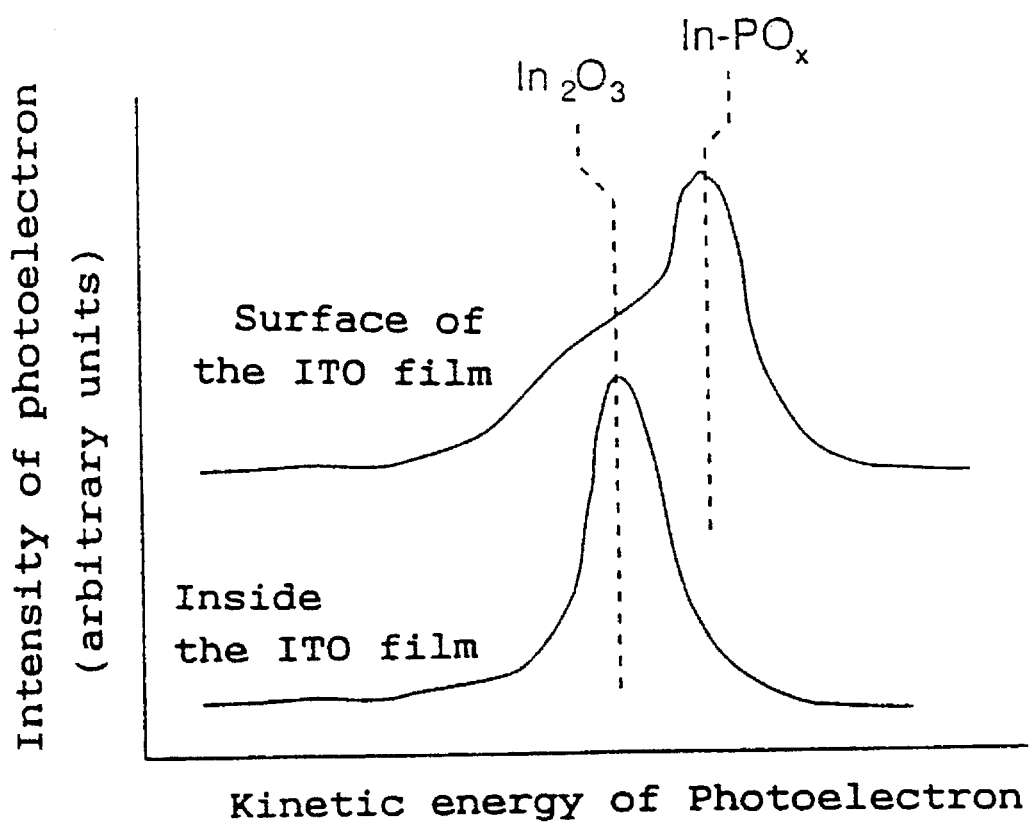
FIG. 2 is an element distribution diagram on a surface and inside of a conductive film applied to the first embodiment of the present invention.

The results obtained by analyzing by electron spectroscopy for chemical analysis (ESCA) the chemical state of the surface of the transparent conductive film 3 composed of ITO subjected to the phosphine plasma is shown in FIG. 2.

Indium oxygen ($In_2O_3$) is the principal ingredient inside the ITO film, but indium phosphorus oxide ($InPO_x$) is the principal ingredient in the surface of the ITO film. Thus, the chemical state of the surface is different from the chemical state of the body of the ITO film.

After the growth nucleus layer 5 is formed as described above, the substrate temperature is changed to 100° to 200° C., hydrogen is introduced to set the pressure in the chamber to 0.6 Torr, an RF power source of 13.56 MHz and 400 W is connected between electrodes to generate a plasma. A mixed gas of silane ($SiH_3$) and $PH_3$ is introduced into the chamber every ten seconds approximately 100 times, and silicon (semiconductor layer 6) is grown on the transparent conductive ITO film 3. Hydrogen functions as an etching gas, ant the $pH_3$ in the mixed gas is used to make the semiconductor layer 6 into an n-type semiconductor.

Now, ITO functions as an electrically degenerated semiconductor. Since ITO is an oxide, however, it resembles in chemical composition the quartz or glass constituting the insulating substrate 1, i.e., silicon oxide. In the selective growth by a conventional method, when the region 3 of ITO and the region 9 of quartz are compared with each other, the deposition of silicon in those regions differs little. According to the experiments of the inventor and others, the reproducibility of selective growth is poor. Non-selective deposition of the silicon film results frequently, and the silicon film is sometimes deposited only on the quartz substrate.

Using the process of the present invention, when the insulating substrate 1 and the transparent conductive film 3 are compared with each other, it has been confirmed that silicon can be grown selectively with high reproducibility since the chemical states of their surfaces are very different from each other. When an unprocessed substrate is used, reproducibility of the selective growth of silicon is not very high.

The chemical composition of the surface of the transparent conductive film can be reformed by placing the transparent conductive film in the plasma atmosphere as described above. However, reforming is not limited to the method described, and the growth nucleus may also be formed in the surface layer of the transparent conductive film by chemical reaction, by thermal excitation or by a photochemical reaction. Further, ammonia ($NH_3$) gas or a gas containing an element in group IIIb, group Ivb, group Va, group VIb or group VIIb that does not contain the same elements as the transparent conductive film and the insulating substrate may be adopted as the gas for reforming the surface of the transparent conductive film, and any gas capable of changing the chemical composition of the surface of the insulating substrate may be used. Besides, when the surface of the ITO film is reformed by $NH_3$ gas, a transparent indium nitride layer is formed on the surface thereof.

As described above, since the element in group IIIb, group Ivb, group Va, group Vib or group VIIb couples stably with silicon and germanium, the growth nucleus layer 5 has a selective growth accelerating function, and silicon or germanium grows adequately and selectively on the transparent conductive film on the insulating substrate 1. As a result, it is expected that the present invention will be applied to an active matrix type liquid crystal display unit and a solar cell element.

The growth nucleus layer formed on one surface of the transparent conductive film also functions to protect the transparent conductive film against reduction by a hydrogen plasma or the like during the selective growth of silicon. And a reduction-resistant growth nucleus layer will be described in detail as a second embodiment.

(The Second Embodiment)

FIG. 3 to FIG. 6 are sectional views showing a process of preventing deterioration of film quality of a transparent conductive film according to a second embodiment of the present invention.

Figure 3:
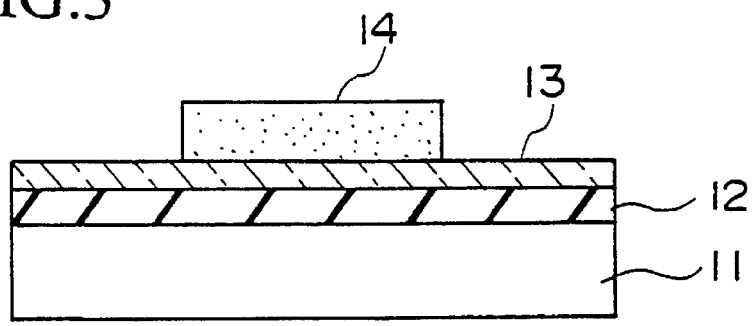
FIG. 3 to FIG. 6 are sectional views showing a processing process for preventing the deterioration of film quality of a transparent conductive film according to a second embodiment of the present invention.

First, as shown in FIG. 3, an insulating film 12 is formed on a transparent insulating substrate 11 composed of glass, quartz or the like, and a transparent conductive film 13 composed of a metallic oxide such as ITO is formed on the substrate by DC sputtering.

Figure 4:
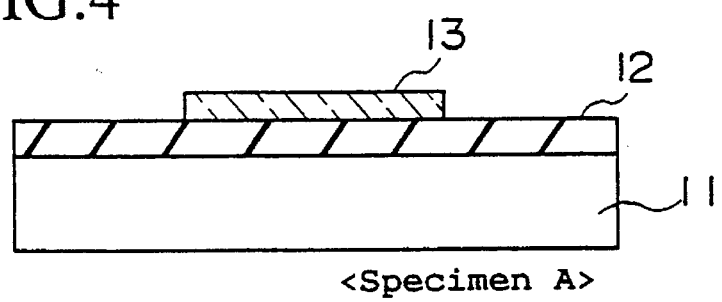

Next, photoresist 14 is applied and is exposed and developed to form a pattern. Then, as shown in FIG. 4, the transparent conductive film 13 is applied with patterning by photolithography using the photoresist 14 as a mask. The photoresist 14 is removed after patterning is completed.

When an active atmosphere containing an element in group Va of the periodic table is generated around the transparent conductive film 13 and the element is made to stick to the surface of the film, the growth nuclei 15 composed of a metallic oxide containing an element in group Va is formed on the surface of the film. Since this growth nucleus layer is formed in a self aligned manner only on the surface of the transparent conductive film 13, it is not necessary to use a special processing or patterning technique.

Figure 6:
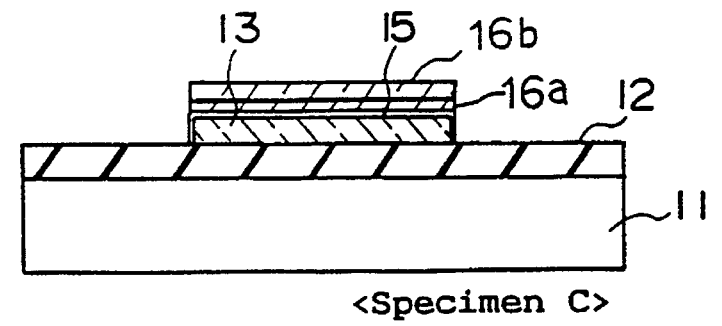

Thereafter, an amorphous semiconductor film is grown by a CVD method as shown in FIG. 6 on the transparent conductive film 13 covered with the growth nucleus layer 15.

Even if a reductive atmosphere is in existence around the transparent conductive film 13 when the semiconductor film 16 is grown, the growth nucleus layer 15 containing an element in group Va is difficult to reduce, preventing deterioration of the transparent conductive film 13. Further, the transparent conductive film 13 cannot be oxidized even in an oxidative atmosphere.

Three specimens were produced by the processes described above, and the compositions of the films were analyzed.

Specimen A

First, an insulating film 12 composed of silicon nitride is grown in a thickness of 3,000 Å on the insulating substrate 11 made of glass by a plasma CVD method. Then a transparent conductive film 13 composed of ITO is formed in a thickness of 500 Å by DC sputtering (FIG. 3), and patterning is applied to the transparent conductive film 13 (FIG. 4).

Specimen B

Next, an insulating substrate 11 on which an insulating film 12 and an transparent conductive film 13 are formed under the same conditions as used to make specimen A is placed on an electrode in the chamber of a plasma CVD apparatus, the pressure in the chamber is maintained at 1.0 Torr while introducing hydrogen ($H_2$) gas containing approximately 0.5 at. % of phosphine ($PH_3$) at 180 SCCM into the chamber, and a radio frequency power source of 300 W and 13.56 MHz is connected to the electrodes.

Figure 5:
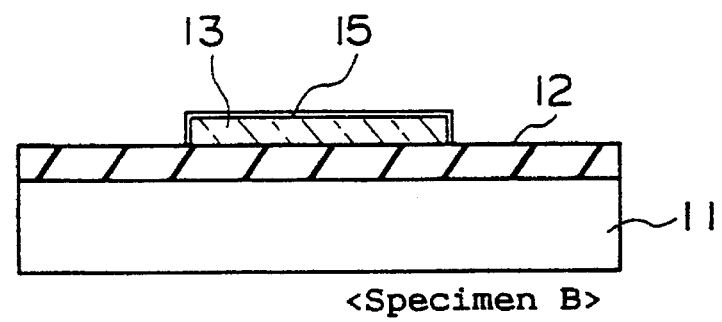

A plasma is generated around the insulating substrate 11 is maintained at 200° C. or below, preferably at room temperature, for 20 minutes, forming the growth nucleus layer 15 containing phosphorus on the surface of the transparent conductive film 13 (FIG. 5).

Specimen C

Next, after processing the surface of the transparent conductive film 13 under the same conditions used to make specimen B in the chamber of the CVD apparatus, a mixed gas of $SiH_4$ and $PH_3$ is introduced intermittently for several seconds every ten seconds while introducing $H_2$ gas at a constant flow rate into the chamber, to grow the semiconductor layer 16a composed of silicon doped with phosphorus only on the transparent conductive film 13. Thereafter, a semiconductor film 16b made of silicon is formed by glow discharge (FIG. 6). This silicon growth method is excellent in a point that microcrystalline silicon can be grown with low resistance, but when the bare transparent conductive film 13 having no growth nucleus layer 15 thereon is exposed to hydrogen plasma for a long period of time, it causes deterioration of film quality of the transparent conductive film 13.

The selective growth of silicon is described by G. N. Parsons, Applied Physics Letter, 59, pp. 2546–2548 (1991).

Figure 7:
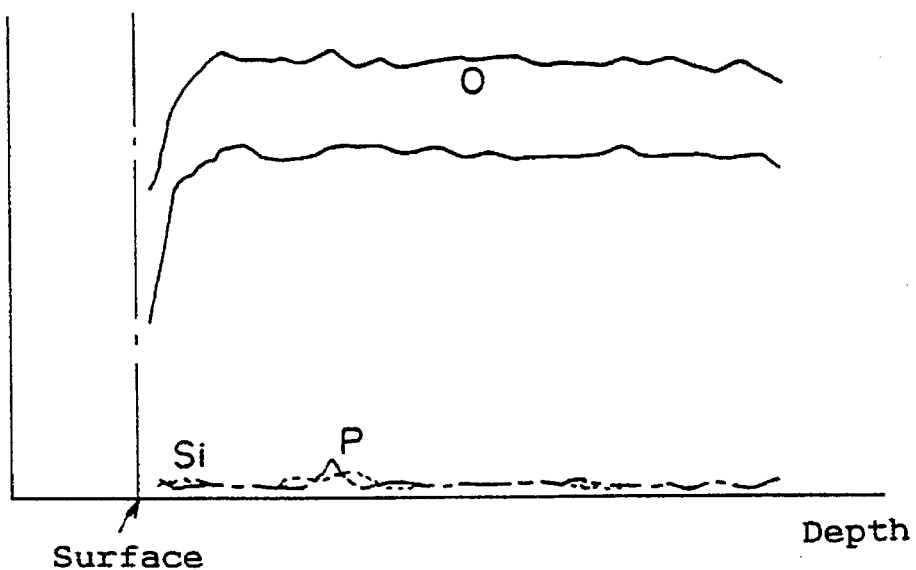
FIG. 7 is an element distribution diagram showing the result of analysis by AES of a transparent conductive film before processing to prevent deterioration of the film quality according to the second embodiment of the present invention.
Figure 8:
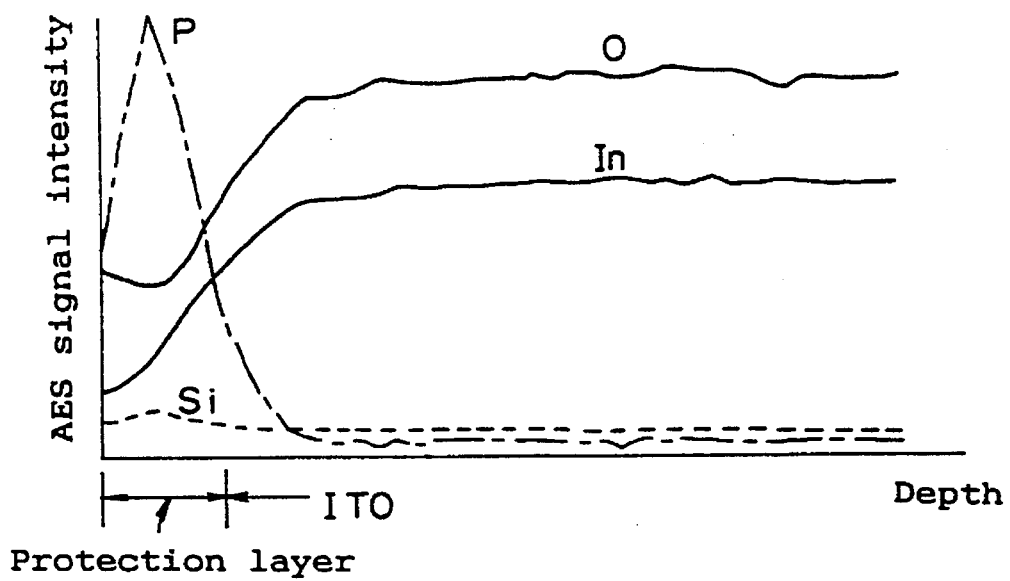
FIG. 8 is an element distribution diagram showing the result of analysis by an AES method after processing to preventing deterioration of the film quality.
Figure 9:
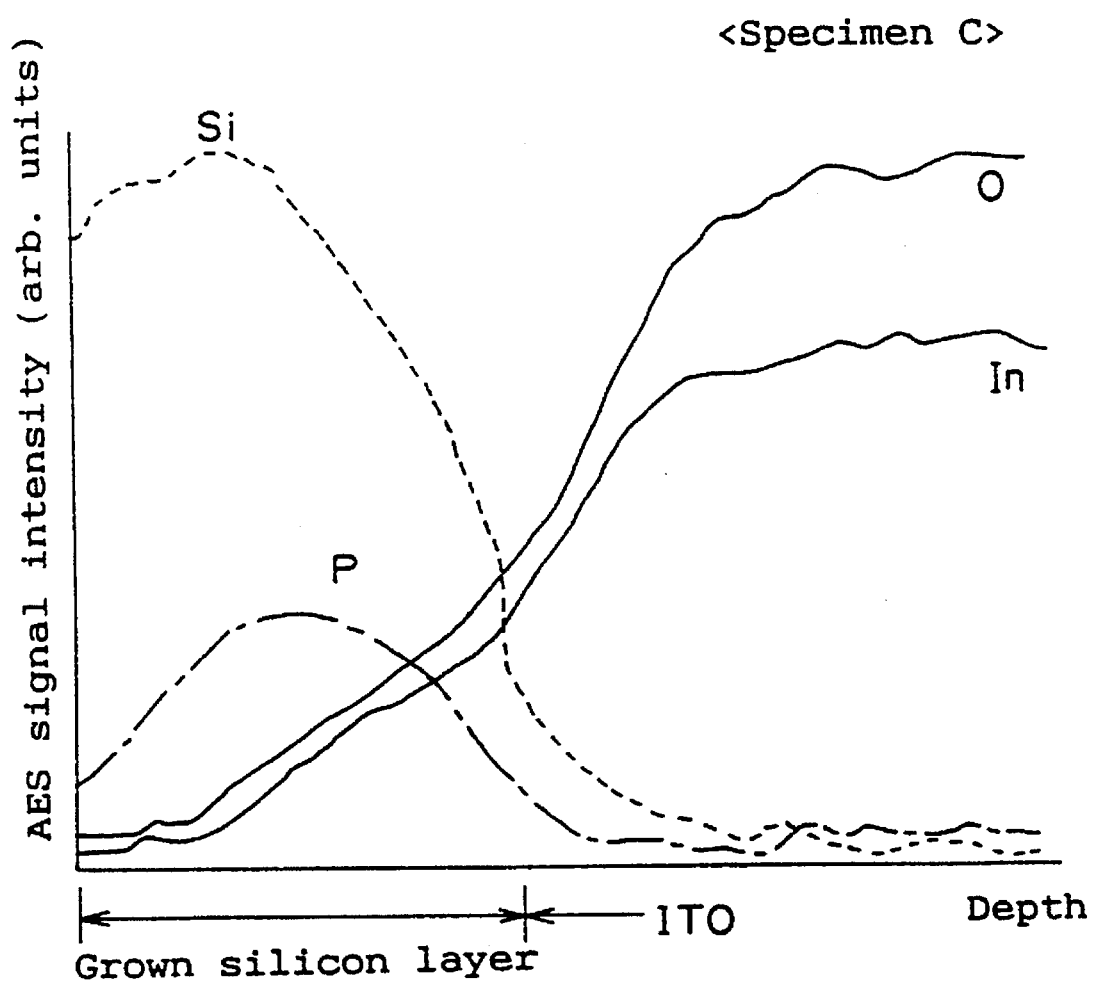
FIG. 9 is an element distribution diagram showing the result of analysis by AES after a semiconductor is formed on the transparent conductive film covered with a protective layer in the second embodiment of the present invention.

When the elemental compositions of the transparent conductive film 13 of specimens A and B, and the transparent conductive film 13 and the semiconductor film 16a of the specimen C, were analyzed by an Auger electron spectroscopy (AES) method, the results shown in FIG. 7, FIG. 8 and FIG. 9 were obtained. (A curve for tin is not shown in these figures, because tin exists stably in the transparent conductive film 13 when using the process described above.)

FIG. 7 shows the results of the analysis of specimen A, and also shows that oxygen and indium are in existence evenly in the depth direction in the transparent conductive film 13 composed of ITO. The curves showing phosphorus and silicon tall within a range of measurement errors, and it may be considered that these elements are not present in meaningful amounts.

FIG. 8 shows the result of the analysis of specimen B, and it is recognized that a compound containing phosphorus, i.e., the growth nucleus layer 15, exists on the surface of the transparent conductive film (ITO film) 13.

Figure 10A:
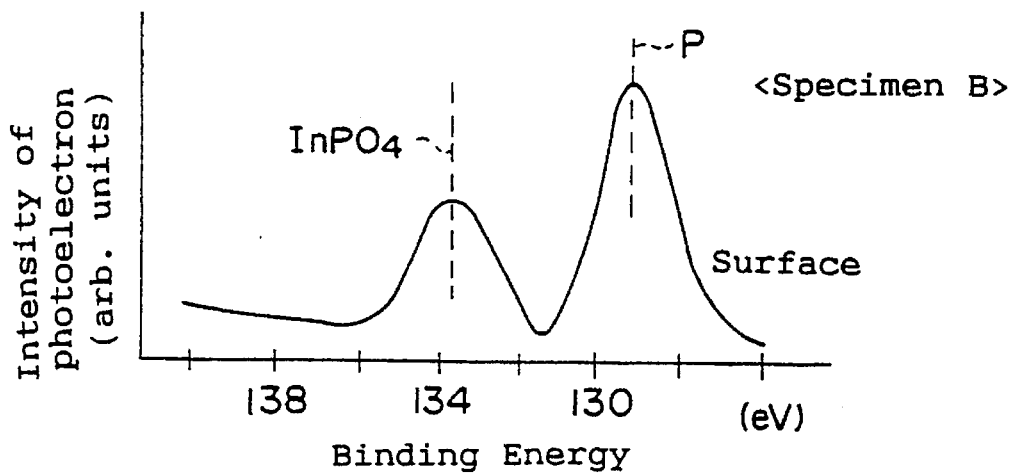
FIG. 10A shows the result of analyzing by the ESCA the surface of a transparent conductive film processed to prevent deterioration of film quality with particular reference to phosphorous atoms.

The results of making further observation or fine surface of the transparent conductive film 13 in specimen B by electron spectroscopy for chemical analysis (ESCA) with particular reference to phosphorus is shown in FIG. 10A. According to FIG. 10A, coupling between indium and oxygen (In—O) is not seen, but it is seen that a growth nucleus layer 15 composed of $InPO_4$ and P formed by replacing a part of oxygen of ITO with phosphorus has been deposited on the surface.

Figure 10B:
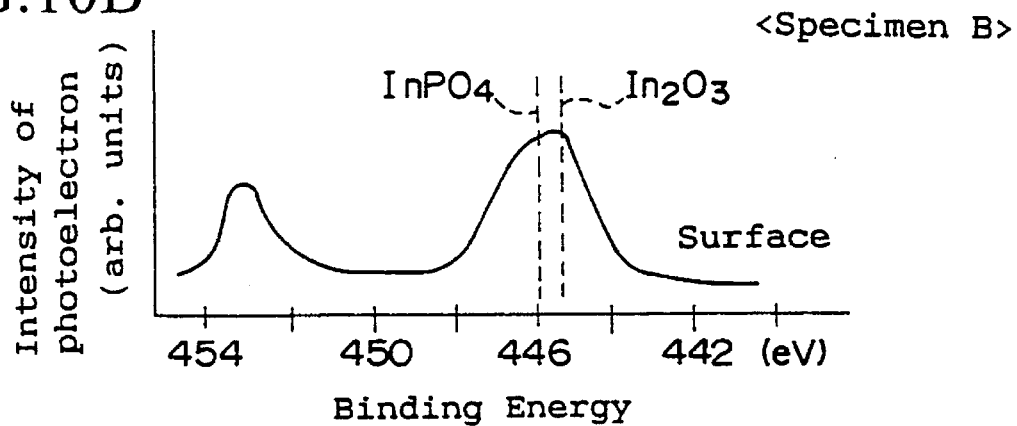
FIG. 10B shows the result of analyzing by ESCA the surface of the transparent conductive film with particular reference to indium atoms.

The results obtained when the surface of the transparent conductive film 13 is observed by ESCA with particular reference to indium atoms, is shown in FIG. 10B. It is seen that there is a peak in the existence of oxidized indium, but the composition of ITO has not been collapsed.

Figure 10C:
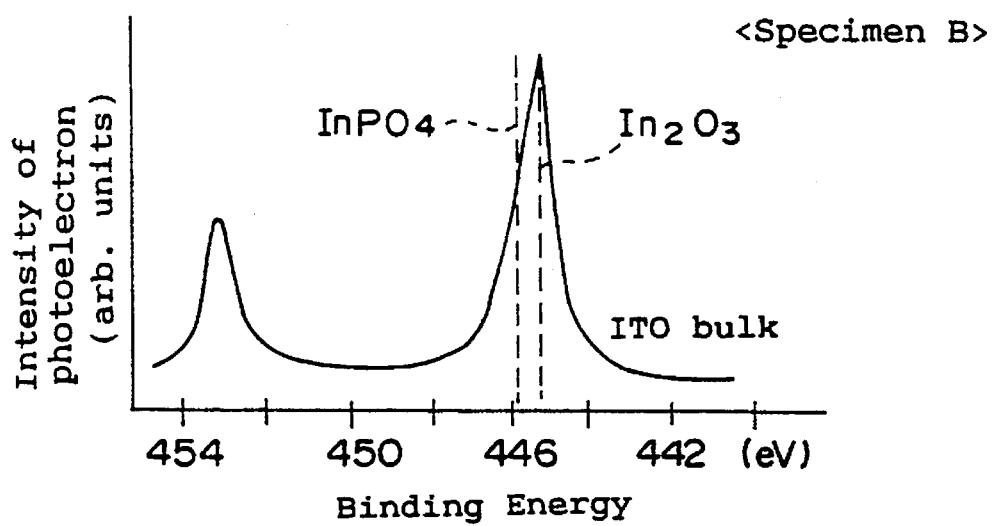
FIG. 10C shows the result of analyzing by ESCA the bulk of the transparent conductive film with particular reference to indium atoms.

The results obtained when the bulk of the transparent conductive film 13 is observed by ESCA with particular reference to indium atoms is shown in FIG. 10C. It is seen that, while there is a peak in the existence of oxidized indium, $InPO_4$ and P are not present, and deterioration of film quality by phosphorus has not resulted. This verifies that the growth nucleus layer 15 is formed only on the surface of the transparent conductive film 13.

FIG. 9 shows the result of analysis of the specimen C. It is seen that no material which hinders electrical connection exists on the interlace between the transparent conductive film (ITO) 13 and the semiconductor film (Si) lab, and the reduction of indium of the surface of the transparent conductive film 13 is small.

Figure 11:
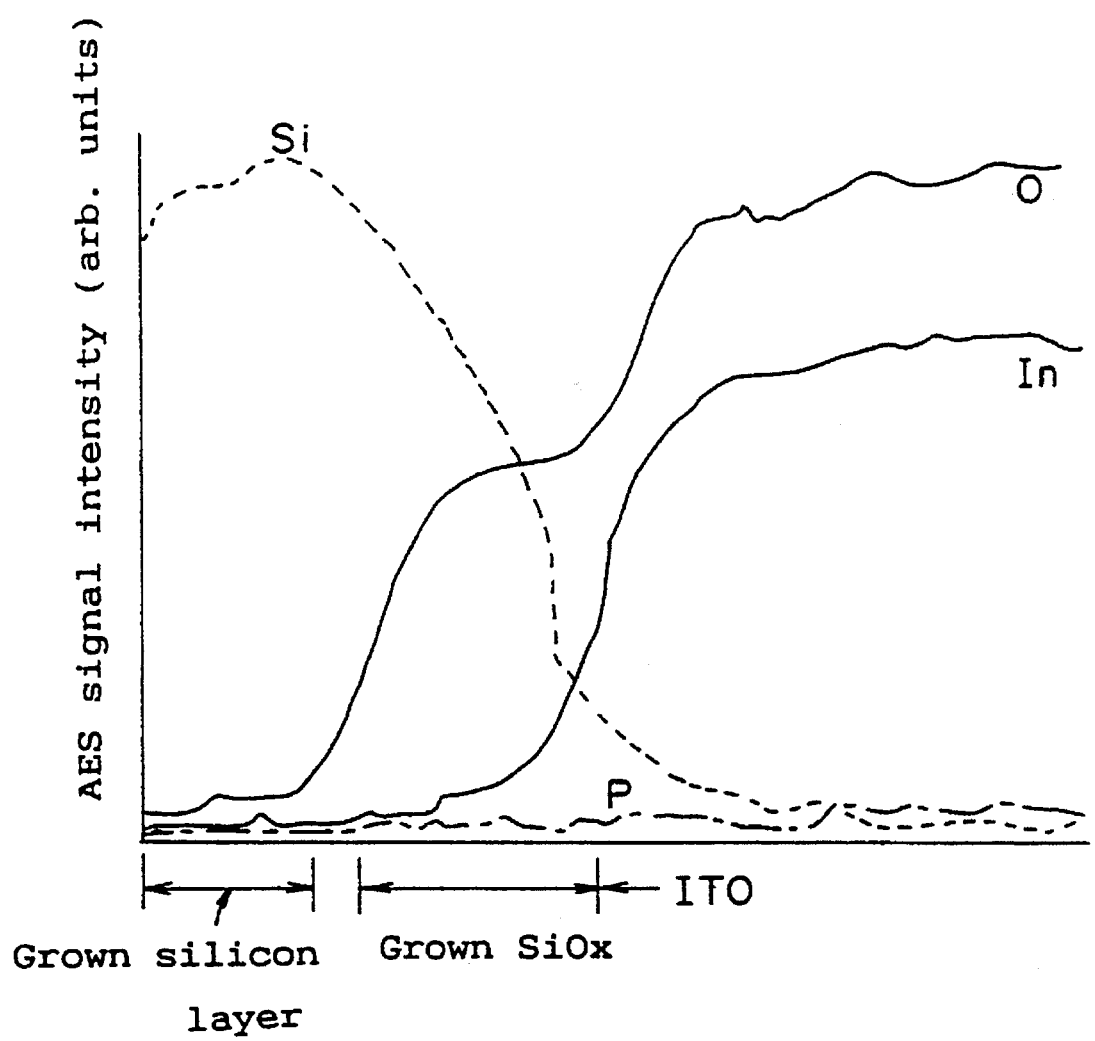
FIG. 11 is an element distribution diagram showing the result of analysis by AES of a conventional layer construction in which a semiconductor is grown on a transparent conductive film in a plasma atmosphere without processing to prevent the deterioration of film quality.

The surface of a transparent conductive film composed of ITO is exposed to a $SiH_4$ plasma in a reductive atmosphere, without forming a growth nucleus layer 15 described above, and a non-doped silicon film is grown selectively on this transparent conductive film. The results obtained when the silicon film and the transparent conductive film 13 are analyzed by AES, as shown in FIG. 11. It is seen that the oxygen liberated from the ITO film by reduction is taken into silicon, $SiO_x$ exists on the interface between the silicon film and the ITO film, and the amount of indium on the interface between the ITO film and the silicon film is lower as compared with the amount shown in FIG. 9. Since $SiO_x$ is exists as an insulating film, it causes interruption of electrical contact between the silicon film and the ITO film.

Figure 12A:
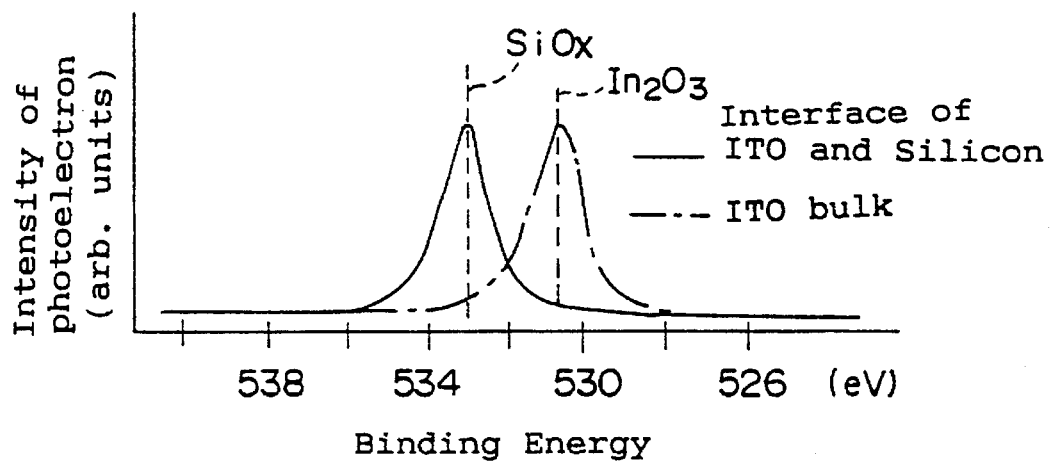
FIG. 12A shows the result of analyzing by ESCA the interface between a transparent conductive film and a semiconductor film and the bulk of the transparent conductive film in the conventional layer construction shown in FIG. 9 with particular reference to oxygen atoms.
Figure 12B:
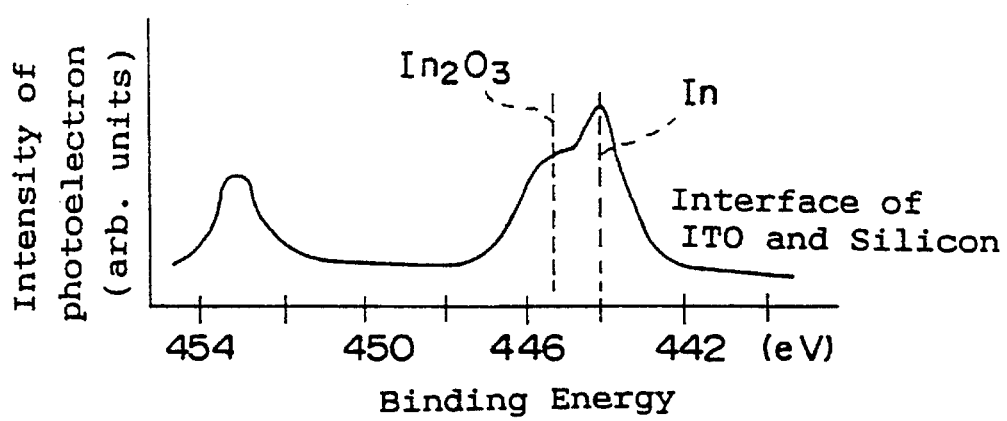
FIG. 12B shows the result of analyzing by ESCA the surface of the transparent conductive film with particular reference to indium atoms.
Figure 12C:
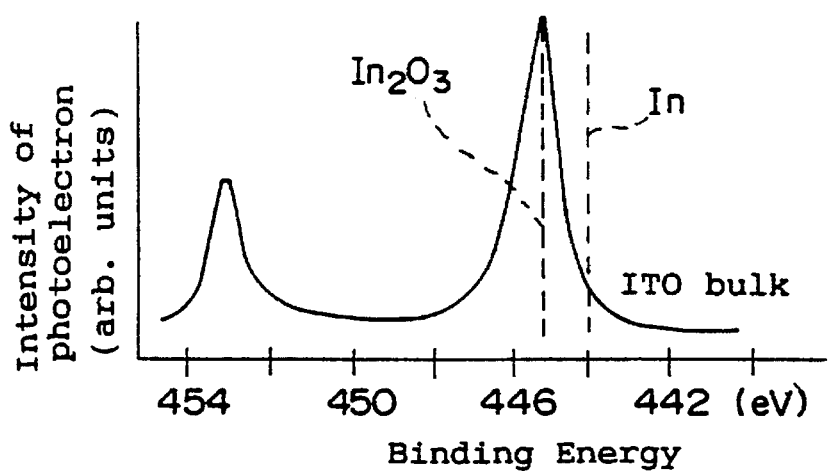
FIG. 12C shows the result of analyzing by ESCA bulk of the transparent conductive film with particular reference to indium atoms.

First, as shown with solid lines in FIG. 12A to 12C, it is seen that $SiO_x$ is formed on the interface between the ITO film and the silicon film. This result when the oxygen liberated from the ITO film by reduction is coupled with silicon.

Figure 13A:
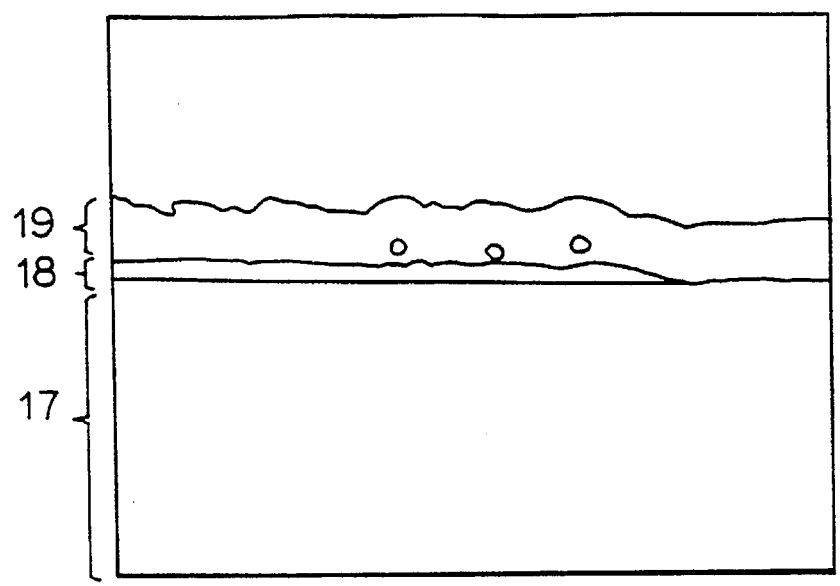
FIG. 13A and FIG. 13B are diagrams based on photographs obtained by observing by TEM a conventional layer construction in which a semiconductor is grown on a transparent conductive film without processing to prevent deterioration of film quality.
Figure 13B:
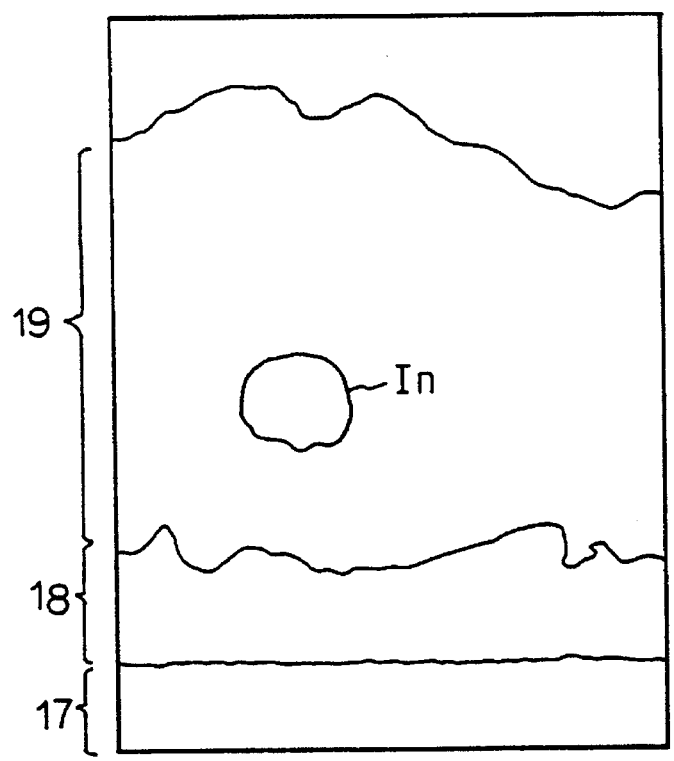

Further, there is a peak in coupling energy showing indium (In) rather than $In_2O_3$ indicating the presence of ITO on the interface as shown in FIG. 12B. This results because when it remains on the surface of the reduced transparent conductive film, it causes abnormal growth. When the abnormal growth is observed with a transmission electron microscope (TEM), it is separated from the transparent conductive film 18 and exists in silicon film 19 forming a lump above a insulating substrate 17, as seen in FIG. 13A and FIG. 13B. The projecting portion is a lump which impairs the flatness and the quality of the film.

The composition of the bulk of the ITO film was investigated, and the results of analysis are shown with a dashed line in FIG. 12A and a solid line in FIG. 12C. It is seen that the composition of the ITO film was not been collapsed.

Based on these experimental results, it is seen that the surface of ITO that is not covered by the growth nucleus layer is reduced when silicon is grown on that surface.

Figure 14A:
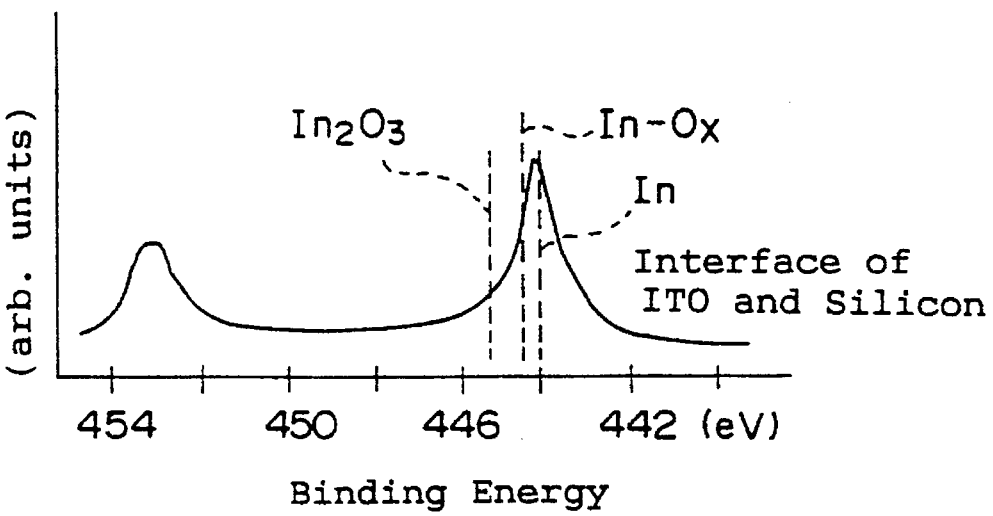
FIG. 14A shows the result of analyzing, by ESCA the interface between a transparent conductive film and a semiconductor film in a laminated construction in which a semiconductor is grown after exposing the transparent conductive film to a hydrogen plasma without processing to prevent deterioration of film quality with particular reference to indium atoms.

The results of the analysis by ESCA of the surface of the ITO film when it is placed in hydrogen plasma for 10 minutes at a substrate temperature of 200° C., and silicon is deposited on the film, is shown in FIG. 14A and FIG. 13B.

Figure 14B:
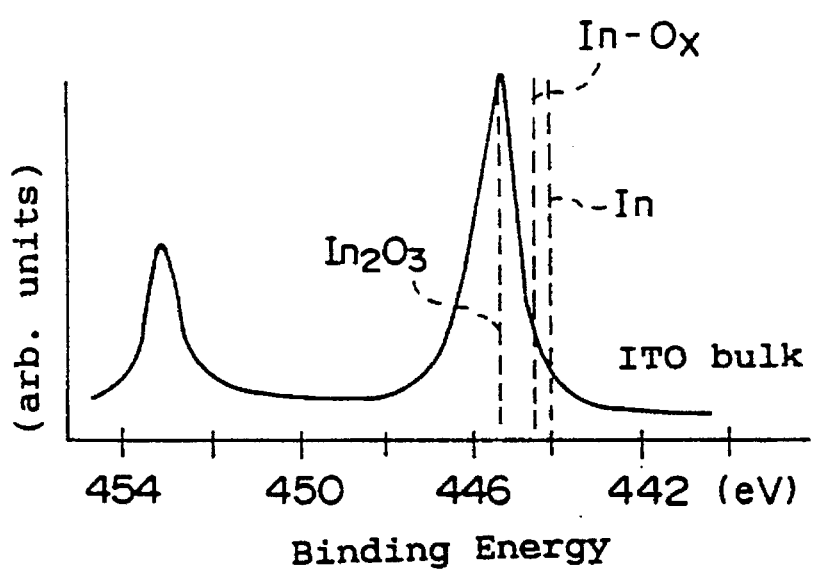
FIG. 14B shows the result of analyzing by ESCA the bulk of the transparent conductive film with particular reference to indium atoms.

In FIG. 14A, showing the interface between the ITO film and the silicon film, the surface of the ITO is reduced and the generation of metallic indium (In) and In—$O_x$ in a low oxidation state are observed when a Si:H complex causing abnormal growth is silicon. As shown in FIG. 14B, the composition was not collapsed in the bulk of the ITO film.

Figure 15:
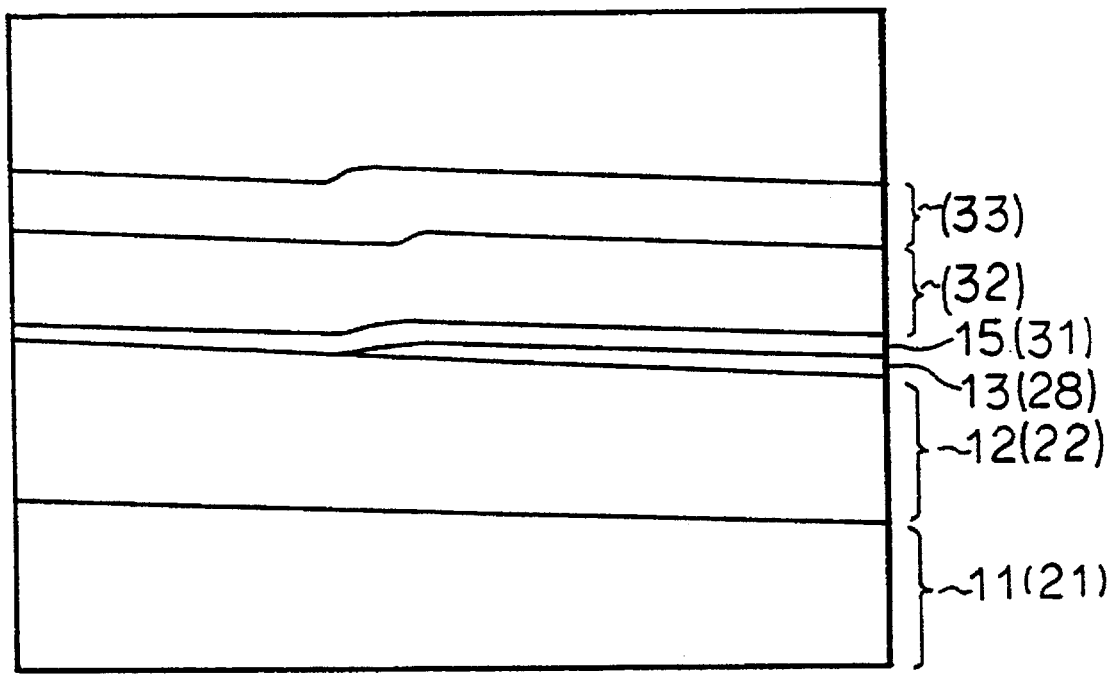
FIG. 15 is a diagram based on a photograph showing a laminated construction processed to prevent deterioration of film quality according to the second embodiment of the invention.

When a growth nucleus layer 15 containing an element in group Va is formed on the surface of the transparent conductive film 13 composed of ITO or the like according to the present invention, and a semiconductor film 16 is formed on the film in a hydrogen plasma atmosphere as described above, neither a lump of indium or irregularity of the semiconductor film 16 can be seen in FIG. 15. Moreover, generation of In—$O_x$ in a low oxidation state on the surface of the ITO is not observed even by ESCA analysis. The element of group Va constituting the growth nucleus layer 15 does not exist as a layer because that element is taken into the semiconductor film 16 when it is formed.

A plasma was generated as the active atmosphere to stick or inject an element of group Va into the film when the above-mentioned growth nucleus layer 15 was formed. However, the active atmosphere is not limited to a plasma, but may be optical CVD utilizing excitation of surface reaction by ultraviolet rays, by thermal CVD for heating a gas or a substrate, or by a combination of these methods.

A mixed gas of $PH_3$ and $H_2$ was used as the gas used when the growth nucleus layer 15 was formed above but any gas containing $NH_3$, $N_2$, $ASH_3$ or the other element in group Va can be used in a similar manner.

When the growth nucleus layer 15 is formed using $NH_3$, for the transparent conductive film (ITO) 13 applied with patterning as described above is placed on an electrode in a chamber of a plasma CVD apparatus. $NH_3$ gas is introduced into the chamber at a flow rate of 100 SCCM, the pressure is maintained at 1.0 Torr, and electric power of 13.56 MHz and 300 W is applied to the electrode, thereby to generate a plasma around the ITO film.

The insulating substrate 11, maintained at 200° C. or below, preferably at room temperature and was left in plasma for 20 minutes. When the ITO film obtained was analyzed by a secondary ion mass spectroscopy (SIMS), the results shown in FIG. 16 were obtained.

Figure 16:
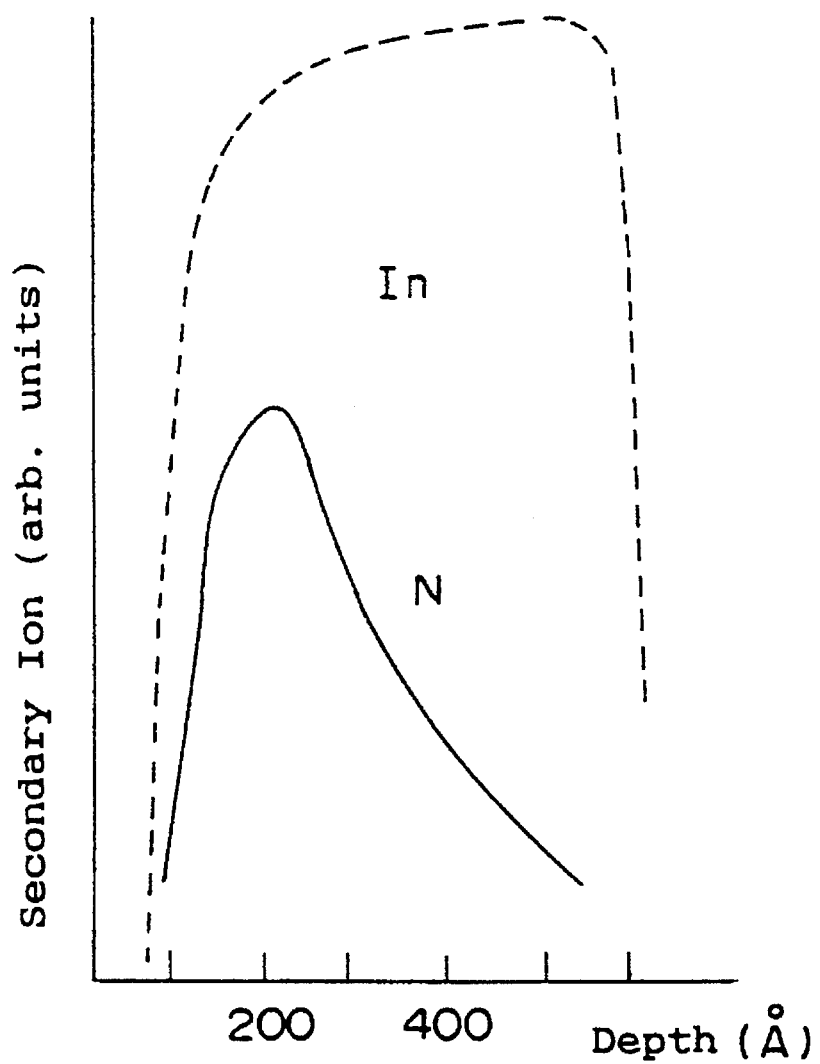
FIG. 16 is an element distribution diagram showing the result of the SIMS analysis of indium and nitrogen in a transparent conductive film when nitrogen gas is used in the process to prevent deterioration of film quality according to the second embodiment of the invention.

According to FIG. 16, nitrogen (N), presumably in the form of an indium nitrate layer, is detected from the outermost surface of the transparent conductive film 13 is detected to approximately 100 A toward the inside of the film. This layer is resistant to reduction and functions as growth nuclei. For example, even when the transparent conductive film is exposed at a Drake Temperature at 270° C. for 10 minutes to the plasma generated by radio frequency electric power at 200 W. no change occurs in the quality of the transparent conductive film.

It is well known that oxygen is released from an ITO film when the plasma contains a reducing material in a process of forming a film on the surface of the ITO film by plasma CVD. When the temperature of the ITO film is 200° C. or below, the reducing material in plasma, such as a hydrogen radical, extracts a small amount of oxygen from the surface of the ITO film and, at the same time, an element in group Va coupled enters the position where oxygen has been extracted.

When the temperature of the ITO film reaches 200° C. or higher, however, oxygen extraction occurs faster rather than a coupling reaction between the ITO film and the element in group Va causing deterioration of the film.

In addition to the above, when the growth nuclei 15 are formed of a compound containing phosphorus, the vapor pressure of phosphorus reaches $2\times10^{-1}$ Torr in the atmosphere at 200° C. or higher. Thus, phosphorus becomes liable to volatilize at a pressure of 0.001 to 10 Torr in of a general plasma CVD process, and the growth nucleus layer 15 becomes more difficult to form. To the contrary, since the vapor pressure of phosphorus reaches $2\times10^{-2}$ Torr at about room temperature, phosphorus becomes more difficult to volatilize, and the growth nucleus layer 15 is formed more readily.

It may be said that it is sufficient that the substrate temperature for the formation of the growth nucleus layer should be 200° C. or lower, but room temperature is most desirable when these points are taken into consideration.

(The Third Embodiment)

The third embodiment is a method of forming a TFT in a liquid crystal display unit, and includes a process of forming the growth nuclei on the surface of the transparent conductive film described above.

Figure 17A:
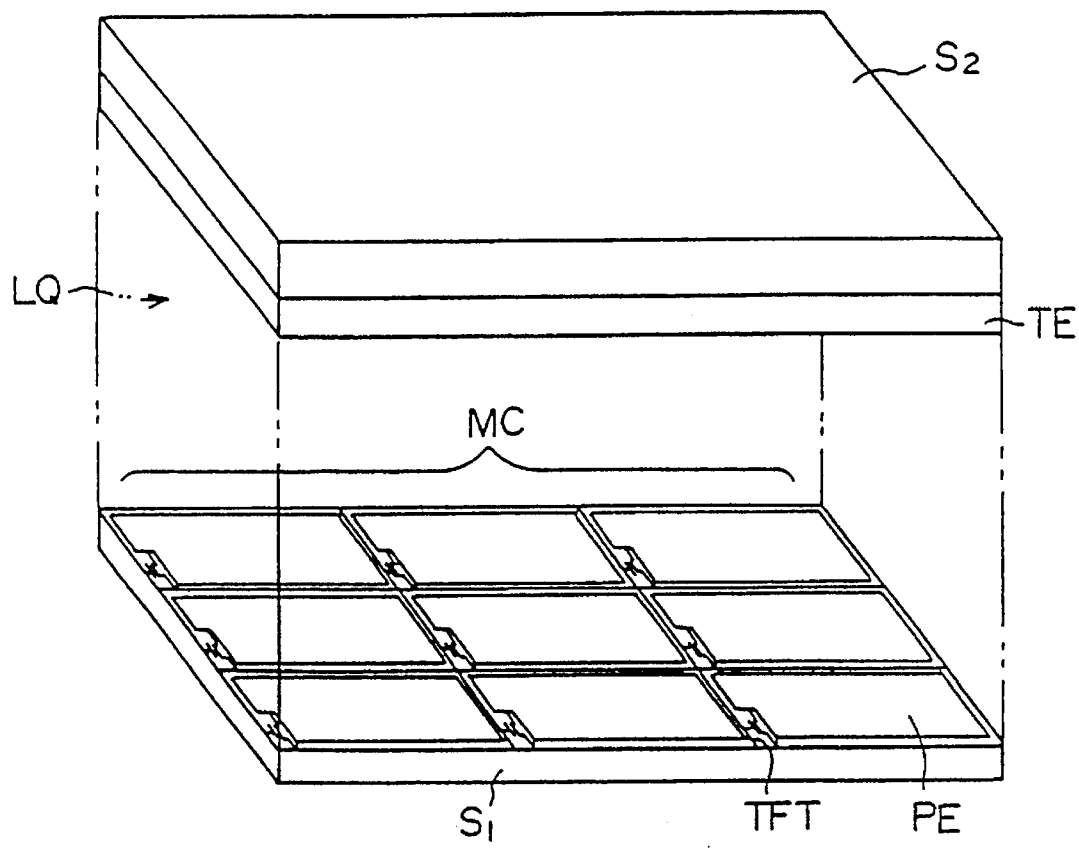
FIG. 17A is a schematic structural view of a liquid crystal display unit.
Figure 17B:
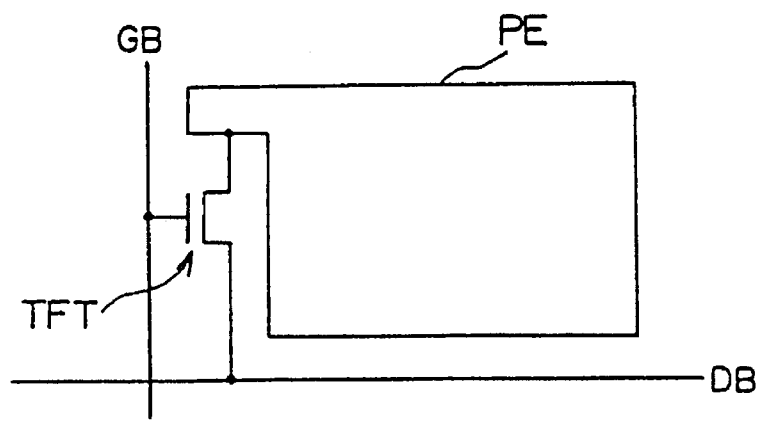
FIG. 17B is an equivalent circuit diagram showing a picture element and a TFT of the liquid crystal display unit.

Prior to the description of the embodiment a general construction of a liquid crystal display unit will be described with reference to FIG. 17A and FIG. 17B.

In a liquid crystal display unit, will be described with reference to FIG. 17A, the surface of a first insulating transparent substrate $S_1$ and the under surface of a second insulating transparent substrate $S_2$ are arranged so as to face each other leaving a space therebetween, a matrix circuit MC is formed on the surface of the first insulating transparent substrate $S_1$ and a transparent electrode TE is formed on the under surface of the second insulating transparent substrate $S_2$. A liquid crystal (LQ) is interposed between the transparent electrode TE and the matrix circuit MC.

The matrix circuit MC includes a plurality of TFT's arranged in a matrix form and a plurality of picture element Electrodes PE's that form pairs with the TFT's. The gate of the TFT is connected to a gate bus line GB extending in one direction as shown in FIG. 17B, the drain of the TFT is connected to a drain bus line DB extending in a direction meeting at right angles with the gate bus line GB, and the source of the TFT is connected to the picture element electrode PK. The gate bus line GB or seam bus line and the drain bus line DB or data bus line are insulated from each other through an insulating film not shown.

The direction of light transmission of the liquid crystal LQ in the region located above a picture element is varied by the voltage applied between the picture element electrode PE and the transparent electrode TE, to visualize the picture element display.

FIG. 18A to FIG. 18G illustrate a process for forming the picture element electrode and the TFT connected thereto.

Figure 18A:
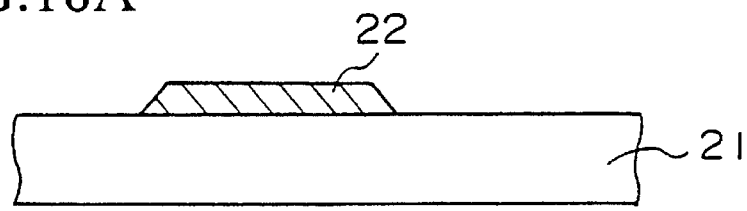
FIG. 18A to FIG. 18G are sectional views showing a process of forming a pictured element electrode and a TFT according to a third embodiment of the present invention.

First, a Cr film 1,000 Å thick is formed on an insulating transparent substrate 21 composed of glass, quartz or the like, by DC sputtering. Then, as shown in FIG. 18A, patterning is applied to the Cr film by photolithography, to form a shading film 22 in a TFT forming region. The shading film 22 is formed for the purpose of preventing an increase in dark current of the TFT to be produced.

Figure 18B:
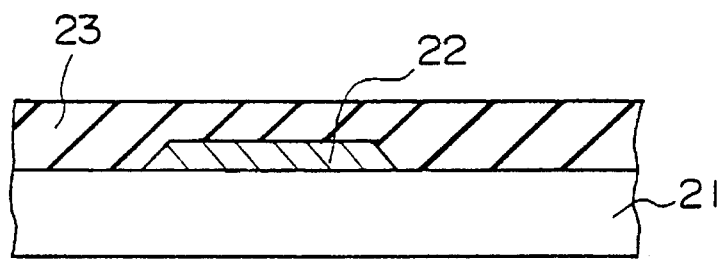

Next, as shown in FIG. 18B, $SiN_x$ is formed by plasma CVD as an interlayer insulating film 23 covering the shading film 22 and the transparent substrate 21.

Figure 18C:
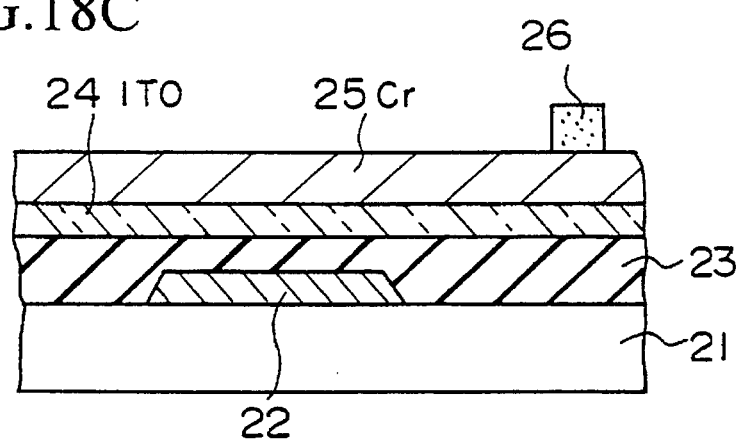

Thereafter, as shown in FIG. 18C, an ITO film 24 500 Å thick and a Cr film 25 1,500 Å thick are formed consecutively by DC sputtering. Then photoresist 26 is applied onto the Cr film 25, and is exposed and developed so as to form a pattern along a drain bus line forming region. The photoresist 26 is used as a mask and patterning is applied to the Cr film 25 using an etchant composed of cerium diammonium nitrate and perchloric acid, to form the drain bus line DB composed of the Cr film 25.

Figure 18D:
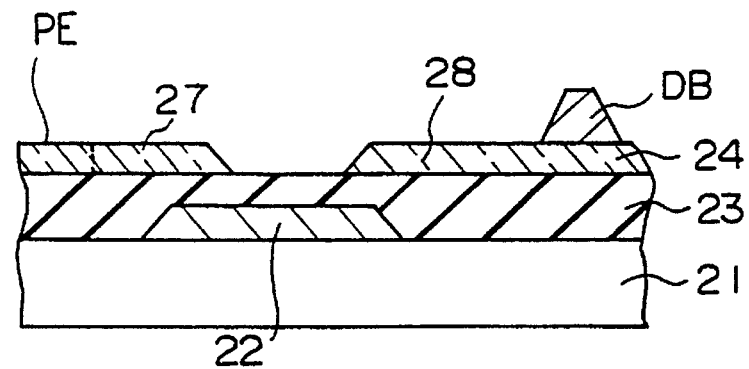

After removing the photoresist 26, a pattern of another photoresist (not illustrated) is formed on the ITO film 24, and patterning is applied to the ITO film 24 using this photoresist and an etchant of nitric acid and hydrochloric acid group. As shown in FIG. 18D, a source electrode 27 and a drain electrode 28, separated from each other, are formed on the shading film 22, and the picture element PE unified with the source electrode 27 is also formed.

Next, after removing the photoresist, the transparent substrate 21 is placed on one of a pair of electrodes in the chamber of a plasma CVD apparatus not shown. Then, after reducing the pressure in the chamber, hydrogen gas containing $PH_3$ at 0.5 at. % is introduced at a flow rate of 180 SCCM, the pressure is maintained at 1.0 Torr, and a radio frequency power source of 13.56 MHz and 300 W is applied to the electrodes to generate a plasma around the transparent substrate 21.

Figure 18E:
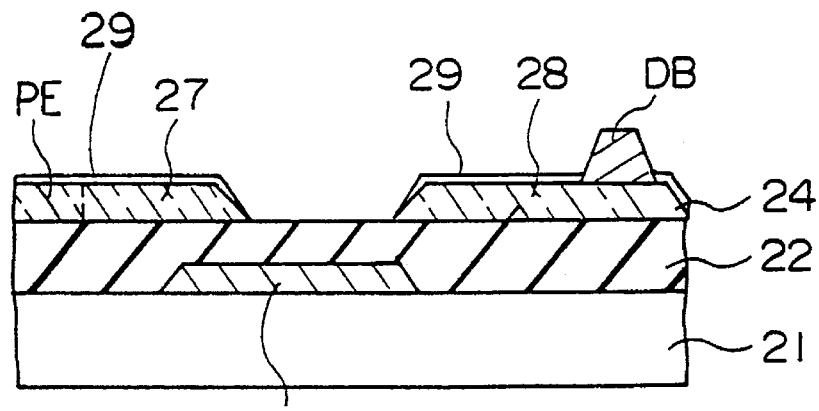

The temperature of the transparent substrate 21 in this case is heated to a constant temperature of 200° C. or lower or is maintained preferably at room temperature. Under such conditions, phosphorus sticks to the surface of the ITO film 24 located in the plasma, and the growth nuclei 29 for preventing reduction are formed on the surface as shown in FIG. 18E.

The reaction gas in the chamber is purged by an inert gas, and $H_2$ gas is introduced into the chamber at the flow rate of 400 SCCM, the pressure is maintained at 1.0 Torr, the temperature of the transparent substrate 21 is raised to 270° C., and the output of the radio frequency power source is lowered to 200 W to generate a hydrogen plasma around the transparent substrate 21.

Figure 18F:
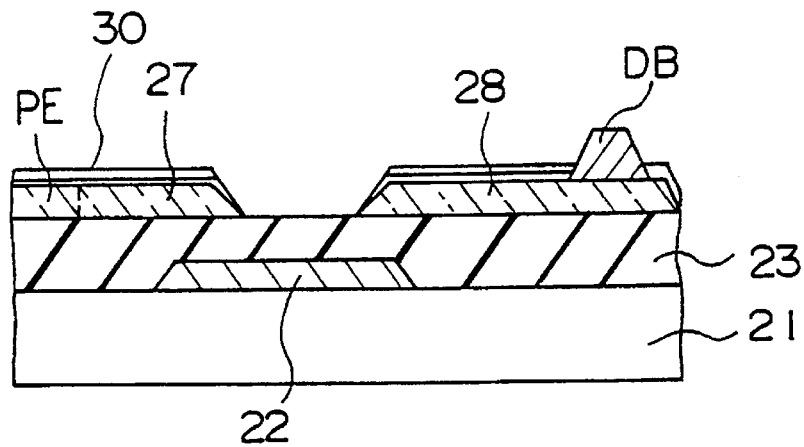
Figure 18G:
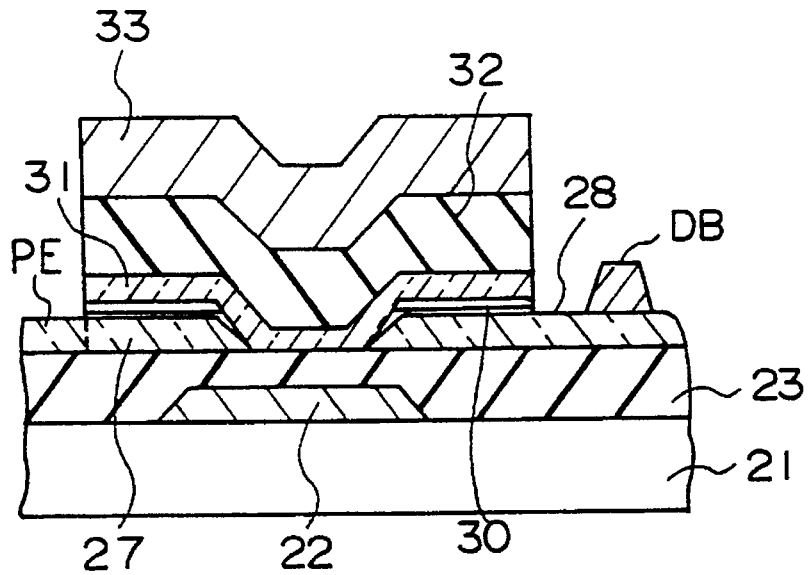

A mixed gas of $SiH_4$ and $PH_3$ is introduced intermittently, to selectively grow a phosphorus doped silicon film only on the transparent conductive film. A mixed hydrogen gas containing $PH_3$ having concentration of 5 at. % at 150 SCCM and $SiH_4$ at 25 SCCM is used for the selective growth. Then, the mixed gas is introduced in 120 cycles, each cycle being for 4 seconds at intervals of 50 seconds. An $n_+$ type silicon layer 30 of microcrystalline silicon (μ-C Si) as shown in FIG. 18F, of 200 Å thick is formed after 100 minutes.

The ITO film 24 is exposed to a hydrogen plasma for a long time when growing the silicon, but deterioration of the film quality is prevented by means of a reduction-resistant growth nucleus layer 29 formed as previously described. Then, after forming an amorphous silicon film 800 Å thick that becomes active semiconductor layer 31 and a $SiN_x$ film 3,000 Å thick that becomes gate insulating film 32 by plasma CVD as shown in FIG. 18D, the transparent substrate 21 is taken out of the chamber. Then, an aluminum film 3,000 Å thick that becomes gate electrode 33 is deposited in by DC sputtering. A sectional view of these layers is shown in FIG. 15, and it is seen that no irregularity has been produced in the active semiconductor layer 31.

Next, by photolithography, patterning is applied continuously to the aluminum film over the active semiconductor layer to form the gate electrode 33 composed of an aluminum film and a gate bus line GB not illustrated, and with the gate insulating film 32 between the gate electrode 33 and the active semiconductor layer 31.

According to the process described above, abnormal growth and deterioration of the film quality of the ITO film 24 forming the source electrode 27 and the drain electrode 28 of the TFT are prevented, both the on and off currents of the transistor are adequate for driving the liquid crystal. Further, lowering of light transmittance and conductivity is controlled without deteriorating the film quality of the ITO film 24 constituting the picture element electrode PE.

In the explanation described above, the interlayer insulating film 23 is formed of silicon nitride, and silicon is grown on the ITO film formed thereon. However, even if the interlayer insulating film 23 is formed of silicon oxide, the growth nuclei are present on the ITO film, and is grown selectively thereon. Further, in a structure where a picture element electrode composed of ITO is formed on a quartz substrate, a glass substrate or the like, and the growth nuclei are formed on the surface of the picture element electrode without forming insulating film layer, the silicon layer is grown selectively on the picture element electrode, as was explained when describing the first embodiment of the invention.

(The Fourth Embodiment)

In the first embodiment, a transparent conductive film has been used as the substrate layer on which silicon is selectively grown, and the transparent conductive film has been placed in a reducing atmosphere containing an element in group IIIb, group Ivb, group Va, group Vib or group VIIb in order to form growth nucleus on the surface having a chemical composition different from that of the interior. A film forming technique is used in the present embodiment instead of the reforming method as a method of forming a chemical growth nucleus layer different from that of the interior of the conductive film.

FIG. 19A to FIG. 19D are sectional views showing selective growth in the fourth embodiment of the present invention.

Figure 19A:
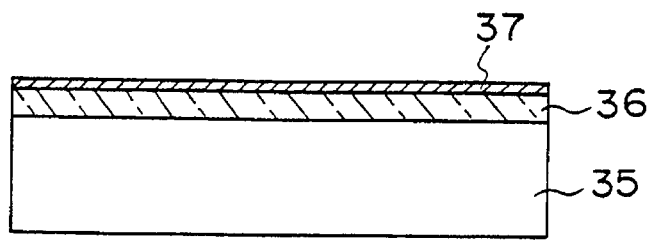
FIG. 19A to FIG. 19D are sectional views showing a method of selective growth according to a fourth embodiment of the present invention.

First, as shown in FIG. 19A, a transparent conductive film 36 500 Å thick composed of ITO, for example, is formed by a sputtering on an insulating substrate 35 composed of quartz, glass or the like. A semiconductor in groups III–V, or groups II–VI is grown on the substrate by an MBE method, an MOCVD method or the like, and serves as the growth nuclei 37. In particular, growth nuclei having good light transmittance are obtainable by using a material having a wide energy band gap of 3 eV or higher such as indium nitride (INN), gallium nitride (GaN) or the like, are preferred.

Figure 19B:
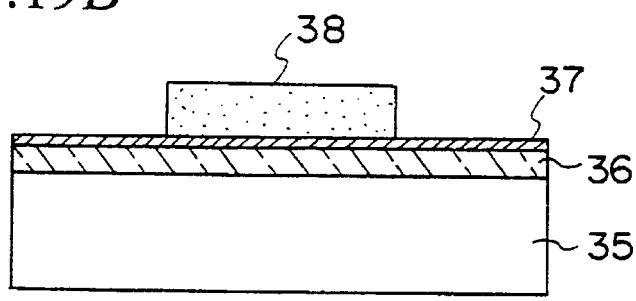
Figure 19C:
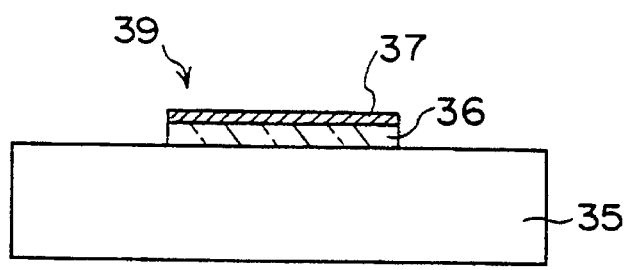
Figure 19D:
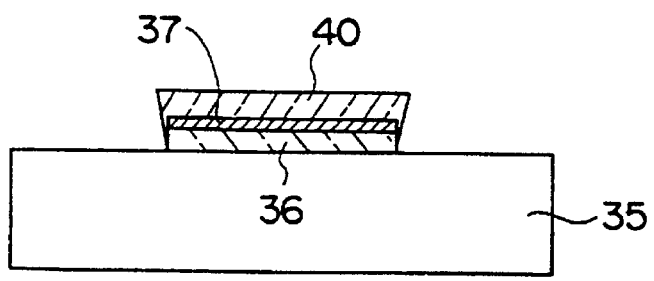

Next, as shown in FIG. 19B, photoresist 38 is applied and a pattern is formed by exposing and developing the photoresist. Thereafter, etching is applied to the transparent conductive film 36 and the growth nucleus layer 37 with the photoresist 38 as a mask to form a conductive pattern 39. Then, after the photoresist 38 is removed as shown in FIG. 19C, etching and deposition are repeated as described in the first embodiment to grow a silicon layer 40 selectively as shown in FIG. 19D.

Since the conductive pattern 39 and the insulating transparent substrate 35 have different chemical compositions, excellent selective growth is achievable by this method, as in the first embodiment. Moreover, since it is possible to apply patterning to the growth nucleus layer 37 simultaneously with the transparent conductive film, the pattern accuracy of the growth nucleus layer 37 is not impaired. In addition, the present embodiment is superior to the first embodiment in that the material of the growth nucleus layer can be freely set.

A similar result can be obtained even when an intermetallic compound of a metal element and silicon, designated a silicide, is applied as the growth nucleus layer.

(The Fifth Embodiment)

Figure 20A:
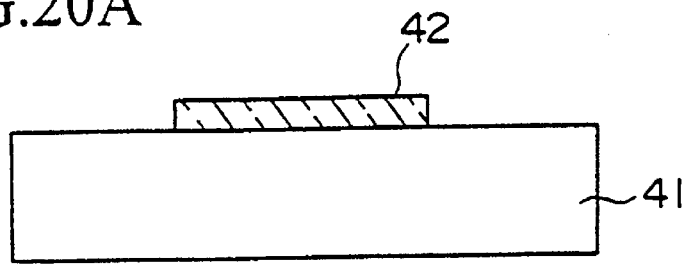
FIG. 20A to FIG. 20D are sectional views showing a method of selective growth according to a fifth embodiment of the present invention.
Figure 20D:
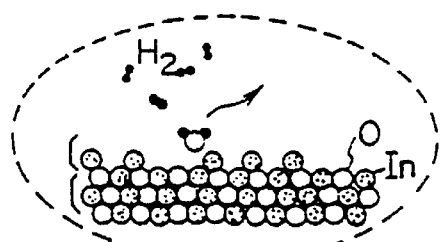
Figure 20B:
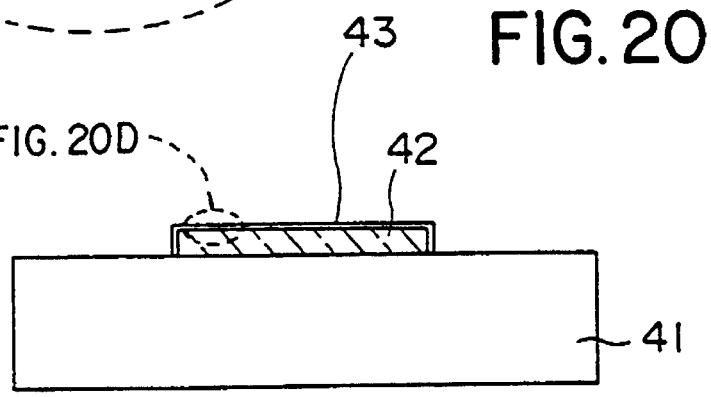
Figure 20C:
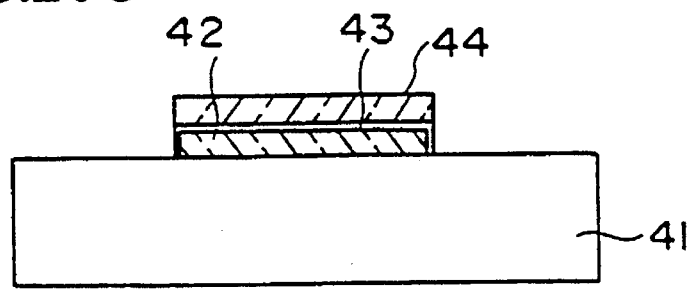

FIG. 20A to FIG. 20C are sectional views showing a selective growth method in the fifth embodiment of the present invention.

First, as shown in FIG. 20A, a transparent conductive film 42 composed of ITO, a transparent conductive oxide film is formed on an insulating substrate 41, and a pattern of the transparent conductive film 42 is formed by photolithography.

Next, using a conventional plane-parallel plate type plasma CVD apparatus, the substrate temperature is set at 270° C., hydrogen gas is introduced into a chamber, the pressure is maintained within a range from 1 to 50 Torr, or preferably 1.0 Torr, and radio frequency electric power of a frequency of 13.56 MHz and an output of 200 W is supplied to the electrode, to generate a hydrogen plasma. The surface of the oxide film is reduced in the reducing atmosphere of the hydrogen plasma; oxygen combines selectively with hydrogen and sublimes. Growth nuclei 43, composed of In and Sn are formed on the surface of the transparent conductive film 42 as shown in FIG. 20B.

When a silicon layer 44 was selectively grown on the transparent conductive film 42 by repeated etching and deposition as described in the first embodiment and as shown in FIG. 20C, superior selective growth was obtained when compared to the case where reduction in a hydrogen plasma was not performed. This is due to the fact that the surface composed of metallized In and Sn couples more readily with silicon than with ITO. However, when the growth nucleus layer 43 is formed utilizing a reducing process, the ITO changes in quality and its conductivity can be lowered, as described in the second embodiment. Hence, reduction is performed for a very short time, e.g. one minute or less.

In order to stabilize an element, such as In or Sn, that is easily removed when growing the silicon layer 44 is a material that combines readily with In and Sn, such as phosphorus (P), may be included in the hydrogen plasma. For example, PH$_3$ gas may be added at a concentration of approximately 0.5 at. %.

The method of forming the growth nuclei according to the present embodiment is characterized by the fact that the chemical composition of the transparent conductive film is made different from that of the surrounding surface by removing an element from the materials constituting the transparent conductive film and the semiconductor.

(The Sixth Embodiment)

Figure 21A:
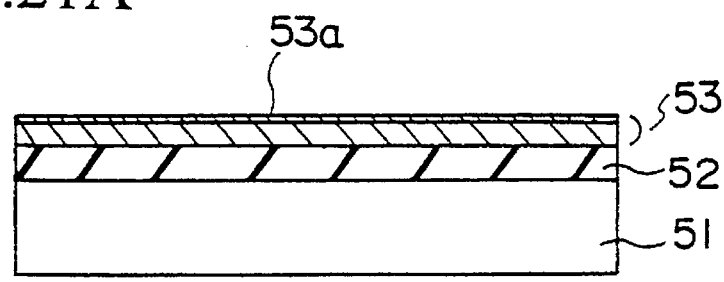
FIG. 21A to FIG. 21C are sectional views showing a method of selective growth according to a sixth embodiment of the present invention.
Figure 21B:
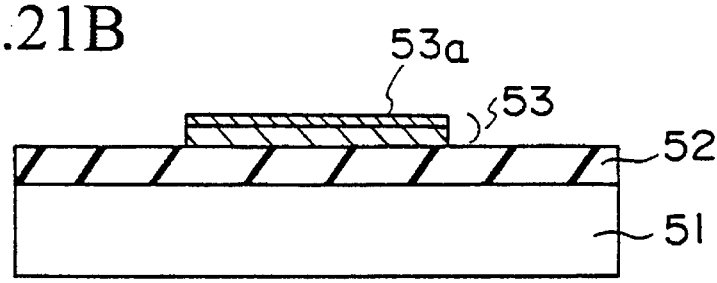
Figure 21C:
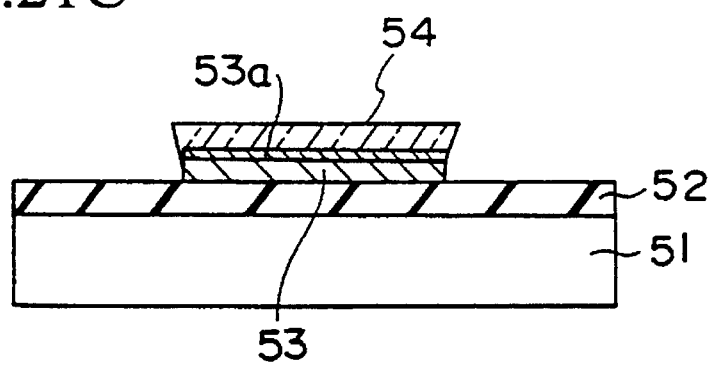

FIG. 21A to FIG. 21C are sectional views showing a selective growth method according to a sixth embodiment of the present invention.

First, as shown in FIG. 21A, a silicon nitride film 52 is deposited on an insulating substrate 51 of quartz, glass or the like by a plasma CVD method. Then, a chrome (Cr) film 53 having a film thickness of 1,000 Å is deposited on the silicon nitride film 52 by vapor deposition. Oxygen is introduced into the chamber of the vapor deposition apparatus at $5\times10^{-5}$ Torr, and the oxygen, approximately 10 at. % reacts the surface layer of the Cr film 53 to form an oxygen-containing chrome (CrO$_x$) layer of the growth nuclei 53a 30 Å in thickness.

As shown in FIG. 21B, patterning is applied to the oxygen containing chrome layer 53a and the Cr film 53 by photolithography method. When etching and deposition are repeated as described the first embodiment to grow a silicon film 54 on the Cr film 53, as shown in FIG. 21C, it was found that superior selective growth resulted as compared to the case where the CrO$_x$ layer 53a is not formed. For example, a growth rate of a silicon film at 3 Å/minute was obtained when the CrO$_x$ layer 53a was formed, and a growth rate at 1 Å/minute was obtained when the CrO$_x$ layer 53a was not present. The oxygen contained in the Cr film 53 becomes SiO$_x$ at time of selective growth of silicon and acts to fix silicon and assist in its selective growth.

In another experiment, a first specimen in which a Cr film containing oxygen on its surface was formed an a glass substrate as described above, and a second specimen in which a Cr film was formed on a glass substrate by a DC sputtering method were prepared. The thickness of both of these Cr films was set to 1,000 Å. Then, an n-type silicon film was formed on the Cr films of the first and the second specimens by selective growth by using of plasma CVD as described in the first embodiment.

Figure 22:
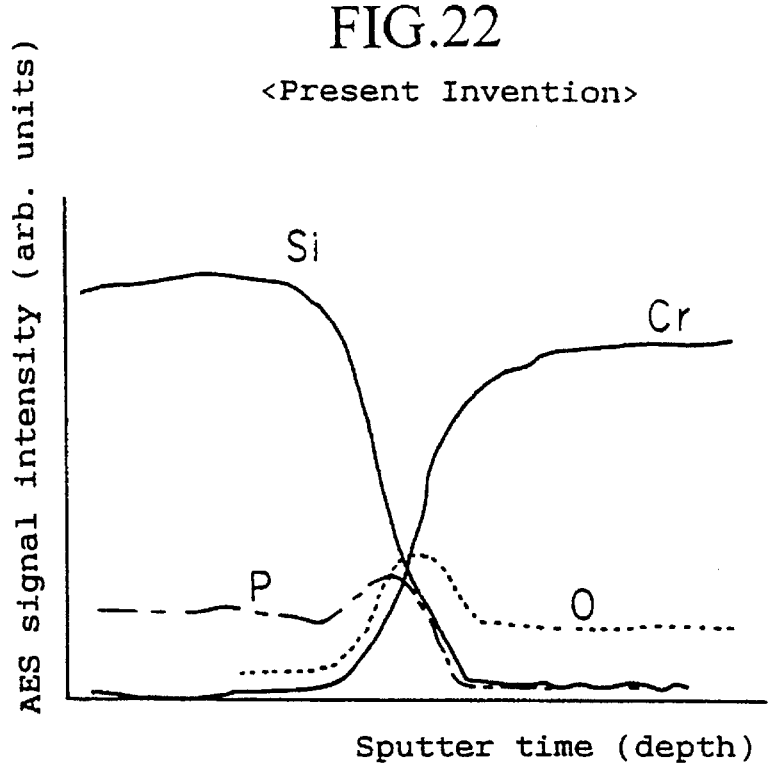
FIG. 22 is an element distribution diagram of a layer construction obtained by selective growth of a semiconductor in the sixth embodiment of the present invention.
Figure 23:
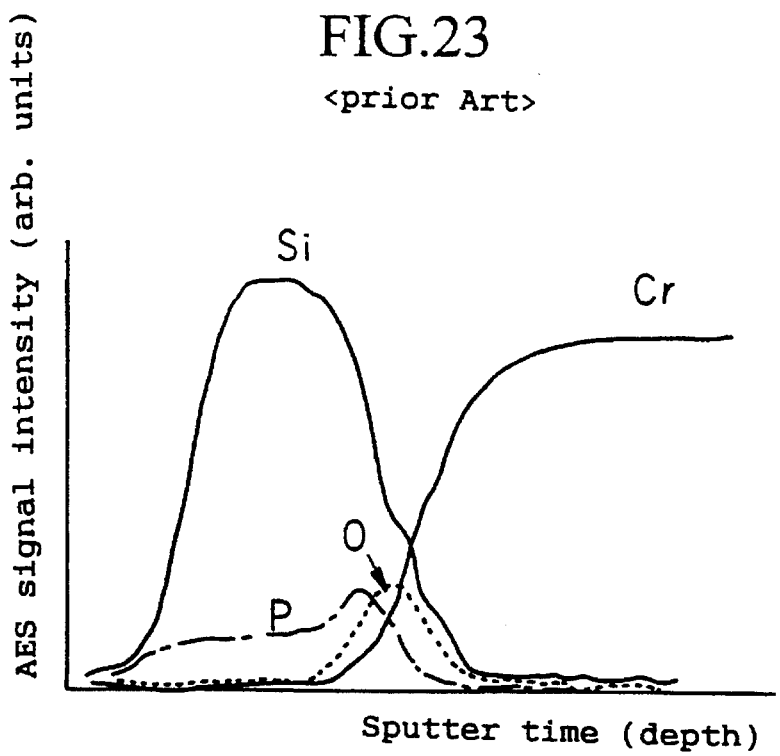
FIG. 23 is an element distribution diagram of a layer construction when a semiconductor is grown selectively by a conventional technique.

FIG. 22 and FIG. 23 show the results of the composition analysis in the depth direction after selective growth of silicon is made on the Cr film with respect to the first and the second specimens. When these are compared with each other, it is observed that the film thickness of silicon is thicker in the first specimen, and that the volume of the silicon film has been increased because of the existence of oxygen. Some oxygen is observed at the interface between the Cr film and the silicon film in the second specimen due to the presence of a natural oxide film. However, insufficient oxygen is present for growing silicon selectively.

Oxygen may be contained in the entire Cr film 53, but excessive oxygen causes deterioration of its electrical characteristics. For that reason, it is desirable to form oxygen-containing layer only on the surface of the Cr film 53 by controlling the amount of oxygen introduced.

This embodiment is characterized by, simultaneously with the formation of a selectively grown substrate layer, an element in group IIIb, group IVb, group Va, group VIb or group VIIb, not contained in the substrate layer, is introduced into the surface of the substrate layer making chemical processing unnecessary. Although oxygen has been used as the element for fixing silicon, the process element is not limited thereto. For example, carbon, iodine, another halogen or the like may be used.

While silicon has been grown selectively in the above-described embodiments, germanium may be used in place of silicon.

What is claimed is:

1. A method of preventing the deterioration of a transparent conductive oxide film, which comprises:

forming a film of a transparent conductive oxide on a transparent insulating substrate;

contacting the transparent conductive oxide film with a phosphorus-, arsenic- or antimony-containing reactive gas to form a layer of growth nuclei on the surface of the film; and contacting said layer with a reducing atmosphere or an oxidizing atmosphere.

2. The method according to claim 1, wherein the transparent conductive oxide film is contacted with gas mixture consisting essentially of hydrogen and phosphine.

3. The method according to claim 2, wherein the transparent conductive oxide is indium tin oxide, and said layer of growth nuclei consists essentially of phosphorus and oxides of phosphorus and indium.

4. The method according to claim 1, wherein the transparent conductive oxide film is contacted with a gas mixture consisting essentially of hydrogen and arsine.

5. The method according to claim 1, wherein a pattern of the transparent conductive oxide film is formed before contacting the film with the reactive gas.

6. The method according to claim 5, wherein a semiconductor film is formed on the transparent conductive oxide film at the same time the film is being contacted with the reducing or oxidizing atmosphere.

7. A method of preventing the deterioration of a transparent conductive oxide film, which comprises:

forming a film of a transparent conductive oxide on a transparent insulating substrate;

contacting the transparent conductive oxide film with a nitrogen-containing reactive gas to form a layer of growth nuclei in an upper part of the film; and contacting said layer with a reducing atmosphere or an oxidizing atmosphere.

8. The method according to claim 7, wherein the transparent conductive oxide is indium tin oxide.

9. The method according to claim 7, wherein the reactive gas contains ammonia or nitrogen.

10. The method according to claim 7, wherein a pattern of the transparent conductive oxide film is formed before contacting the film with the reactive gas.

11. The method according to claim 7, wherein a semiconductor film is formed on the transparent conductive oxide film at the same time the film is contacted with the reducing atmosphere or the oxidizing atmosphere.

* * * * *